United States Patent [19]

Mizerak

[11] Patent Number: 4,926,290

[45] Date of Patent: May 15, 1990

[54] SNAP ON FUSE COVER

[75] Inventor: Dennis S. Mizerak, Brunswick, Ohio

[73] Assignee: The Babcock & Wilcox Company, New Orleans, La.

[21] Appl. No.: 307,022

[22] Filed: Feb. 6, 1989

Related U.S. Application Data

[62] Division of Ser. No. 96,174, Sep. 11, 1987, Pat. No. 4,841,413.

[51] Int. Cl.$^5$ .............................................. H02B 1/00
[52] U.S. Cl. .................................. 361/380; 337/186; 439/893
[58] Field of Search ................... 150/154, 901; 174/138 F, 72 A; 337/34, 186, 208-216, 250; 361/347, 349, 360, 380, 383-384, 400-401, 405, 406, 417, 419-420, 422, 424, 430; 439/135, 138, 146-147, 296, 299, 304, 367, 369, 521, 528, 718, 750, 830, 892, 893

[56] References Cited

U.S. PATENT DOCUMENTS 3,916,082  10/1975  Gillemont .............................. 174/76

Primary Examiner—Gregory D. Thompson
Attorney, Agent, or Firm—Vytas R. Matas; Robert J. Edwards; Daniel S. Kalka

[57] ABSTRACT

A fuse cover includes a transparent resilient cylindrical member, having a full length axially extending slot therein. Two pairs of recesses are provided in the slot for engaging a pair of fuse clips mounted to a circuit board and holding a fuse there between. The tubular member has opposite open ends for ventilation and can be installed over and removed from a fuse without tools and without disturbing the mounting of the fuse.

3 Claims, 1 Drawing Sheet

SNAP ON FUSE COVER

CROSS REFERENCE TO RELATED APPLICATION

This application is a division of Ser. No. 096,174, filed 9/11/87, now U.S. Pat. No. 4,841,413.

FIELD AND BACKGROUND OF THE INVENTION

The present invention relates in general to current overload protection fuses, and, in particular, to a new and useful fuse cover.

Fuses are sometimes mounted between fuse clips connected to printed circuit boards. The same circuit boards may carry switches that must be manually switched from time to time. If the switches are mounted too close to the fuse, or fuse clips, a potential electrocution hazard is created. To avoid this hazard, it is advisable to provide a cover over the fuse clips and their fuse. U.S. Pat. No. 4,473,268 to Watanabe discloses a fuse cover having a base enclosure into which the fuse clips are mounted. The fuse is held in a separate cover plate which is used to simultaneously engage the fuse with its clips and cover the enclosure. This fuse cover is relatively complex and large and requires that the fuse clips be disconnected from a circuit board before the cover can be installed.

U.S. Pat. No. 4,335,415 to Hooberry discloses an enclosure for two fuses in an antenna lightning arrestor. Again, the fuse clips are mounted on the enclosure.

Additional fuse enclosures are disclosed by U.S. Pat. No. 4,563,666 to Borzoni and U.S. Pat. No. 4,599,597 to Rotbart. Again, relatively complex structures are taught.

SUMMARY OF THE INVENTION

The present invention comprises a snap on fuse cover which can be installed over a fuse without disturbing its connection to a circuit board to which the fuse is connected. The fuse cover comprises a tubular member, having opposite open ends and an axially extending slot for embracing contacts or clips to which the fuse is connected. The tubular member is advantageously transparent so that the fuse can be viewed directly without removing the cover. The open ends of the tubular member allow for airflow to avoid overheating of the fuse. The cover takes up little space on the circuit board and effectively isolates the fuse from surrounding structures.

The cover can be installed either by sliding it axially over the fuse contacts or by spreading the tubular member at its slot so that it can be snapped over the fuse. No tools are necessary to install or remove the cover and no modifications must be made to the circuit board.

Accordingly, an object of the present invention is to provide a fuse cover for a fuse connected to a circuit board by at least one connector. The present invention comprises a tubular member having opposite open ends and an axially extending slot for receiving the connector while the fuse is in the tubular member.

A further object of the present invention is to provide a fuse cover which is simple in design, rugged in construction and economical to manufacture.

BRIEF DESCRIPTION OF THE DRAWINGS

In the accompanying drawings, forming a part of this specification, and in which reference numerals shown in the drawings designate like or corresponding parts throughout the same.

DESCRIPTION OF THE PREFERRED EMBODIMENT

Figure 1:
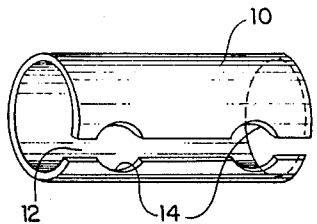
FIG. 1 is a perspective view of a fuse cover in accordance with the present invention.

Referring to the drawings in particular, the invention embodied in FIG. 1 comprises a fuse cover made of a one piece tubular member 10 having an axially extended full length slot 12. Two pairs of recesses 14, which are preferably curved or circular, are provided along slot 12, at a location spaced inwardly from the outer open ends of tubular member 10. Tubular member 10 is preferably made of resilient. transparent plastic or other insulating material with the term tubular meaning to include a cylindrical shape. Other shapes for tubular member 10 may be utilized, however, without departing from the gist of the invention.

Figure 2:
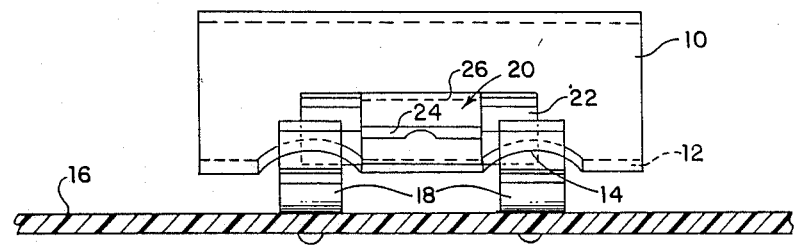
FIG. 2 is a side elevational view of the fuse cover engaged over a fuse, mounted on fuse clips, which are connected to a circuit board.

FIG. 2 shows a circuit board 16 with a fuse connector having metal fuse clips 18, which are spaced apart by a distance approximately equal to the distance between the two pairs of recesses 14 on the tubular member 10. A conventional fuse generally designated 20, has opposite metal caps 22 which are snapped into the respective clips 18. A fusible member 24 is electrically connected between the caps 22. If a current overload is applied across the clips 18, this causes fuseable member 24 to melt.

A transparent enclosure 26, which is advantageously made of glass or ceramic, is mounted between the caps 22 and encloses the fuseable member 24.

Figure 3:
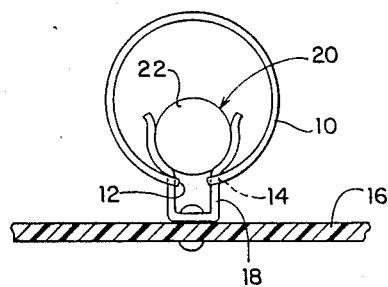
FIG. 3 is an end elevational view of FIG. 2.

To install fuse cover 10, the fuse cover is slid axially across the clips 18, with the clips 18 aligned with the slot 12, until the recesses 14 embrace the clips 18. Alternatively, the cover member 10 can be snapped down onto the fuse. This requires cover member 10 to be made of resilient material so that slot 12 can spread to accomodate the fuse 20 and the upper portions of the fuse clips 18, until the fuse cover is snapped into the position shown in FIGS. 2 and 3.

The fuse cover 10 must have an axial length greater than that of the fuse and clips 18 to avoid an inadvertent touching of the fuse 20 from. The cover is also advantageously transparent so that the fuse can be viewed without removing the cover. The axial slot and the open ends of the cover provide adequate air circulation for ventilating the fuse 20 and preventing a build up of heat.

While a specific embodiment of the invention has been shown and described in detail to illustrate the application of the principals of the invention, it will be understood that the invention may be embodied otherwise without departing from such principals.

The invention claimed is:

1. A fuse cover for covering spaced fuse connectors, on a circuit board, comprising:
   a tubular member being made of resilient transparent insulating material and having opposite ends and an axially extending slot for receiving the connectors, said axially extending slot having recesses which are spaced apart in said slot to conform to the spacing of the spaced fuse connectors on the board, said cover being adapted to slide across the spaced fuse connectors to allow said recesses to engage the connectors.

2. A fuse cover according to claim 1 wherein said slot extends the full axial length of the tubular member.

3. A fuse cover according to claim 2 wherein said recesses are circular.

* * * * *